United States Patent
Cho et al.

(10) Patent No.: US 11,940,837 B2
(45) Date of Patent: Mar. 26, 2024

(54) DISPLAY DEVICE WITH HIGHER SCREEN-TO-BODY RATIO

(71) Applicant: Samsung Display Co., Ltd., Yongin-Si (KR)

(72) Inventors: Seung-Hwan Cho, Yongin-si (KR); Jong Hyun Choi, Seoul (KR); Ju Chan Park, Seoul (KR); Joo Sun Yoon, Seoul (KR); Jong Hyuk Lee, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 533 days.

(21) Appl. No.: 17/260,971

(22) PCT Filed: May 29, 2019

(86) PCT No.: PCT/KR2019/006436
§ 371 (c)(1),
(2) Date: Jan. 15, 2021

(87) PCT Pub. No.: WO2020/017757
PCT Pub. Date: Mar. 23, 2020

(65) Prior Publication Data
US 2021/0320275 A1    Oct. 14, 2021

(30) Foreign Application Priority Data

Jul. 16, 2018    (KR) .......................... 10-2018-0082185

(51) Int. Cl.
*G06F 1/16*    (2006.01)
*H10K 50/84*    (2023.01)
(Continued)

(52) U.S. Cl.
CPC ............. *G06F 1/16* (2013.01); *H10K 50/841* (2023.02); *H10K 50/86* (2023.02); *H10K 59/12* (2023.02);
(Continued)

(58) Field of Classification Search
CPC .... G06F 1/16; H10K 2102/311; H10K 50/86; H10K 50/841; H10K 77/111; H10K 59/12
See application file for complete search history.

(56) References Cited

U.S. PATENT DOCUMENTS 9,430,180 B2    8/2016    Hirakata et al.
10,126,488 B2    11/2018    Lee et al.
(Continued)

FOREIGN PATENT DOCUMENTS

CN    107425036 A    12/2017
CN    107784940 A    3/2018
(Continued)

OTHER PUBLICATIONS

Korean Notice of Allowance corresponding to Application No. 10-2018-0082185 and dated Apr. 24, 2023, 7 pages.

*Primary Examiner* — Mukundbhai G Patel
(74) *Attorney, Agent, or Firm* — Innovation Counsel LLP

(57) ABSTRACT

A display that includes a display panel and a window laminated with the display panel is presented. The display panel may include: a main panel region including a first side extending in a first direction and a second side extending in a second direction crossing the first direction; a first sub-panel region that is in contact with the first side and is bent; and a second sub-panel region that is in contact with the second side and is bent. A panel corner part of the main panel region adjacent to the first sub-panel region and the second sub-panel region is rounded.

19 Claims, 15 Drawing Sheets

(51) Int. Cl.
  *H10K 50/86* (2023.01)
  *H10K 59/12* (2023.01)
  *H10K 77/10* (2023.01)
  *H10K 102/00* (2023.01)

(52) U.S. Cl.
  CPC ...... *H10K 77/111* (2023.02); *H10K 2102/311* (2023.02)

(56) References Cited

U.S. PATENT DOCUMENTS

| | | | |
|---|---|---|---|
| 10,229,632 B2 | 3/2019 | Chung et al. | |
| 10,312,956 B2 | 6/2019 | Cha et al. | |
| 10,367,050 B2 | 7/2019 | Choi et al. | |
| 10,509,436 B2 | 12/2019 | Li et al. | |
| 10,530,912 B2 | 1/2020 | Moon et al. | |
| 10,665,924 B2 | 5/2020 | Son et al. | |
| 10,686,479 B2 | 6/2020 | Cha et al. | |
| 11,233,112 B2 | 1/2022 | Choi et al. | |
| 11,575,779 B2 | 2/2023 | Moon et al. | |
| 11,599,152 B2 | 3/2023 | Sim | |
| 11,611,141 B2 | 3/2023 | Son et al. | |
| 2014/0321072 A1 | 10/2014 | Cavallaro et al. | |
| 2017/0098794 A1* | 4/2017 | Cho | H10K 50/80 |
| 2017/0199544 A1 | 7/2017 | Choi et al. | |
| 2018/0164850 A1* | 6/2018 | Sim | G06F 1/1647 |
| 2018/0178483 A1 | 6/2018 | Chu et al. | |
| 2020/0393870 A1 | 12/2020 | Sim et al. | |

FOREIGN PATENT DOCUMENTS

| | | |
|---|---|---|
| CN | 107799536 A | 3/2018 |
| CN | 108183980 A | 6/2018 |
| EP | 3333667 A1 | 6/2018 |
| JP | 2015-118373 A | 6/2015 |
| KR | 10-1212172 B1 | 12/2012 |
| KR | 10-2016-0097105 A | 8/2016 |
| KR | 10-2017-0040440 A | 4/2017 |
| KR | 10-2017-0095445 A | 8/2017 |
| KR | 10-1919803 B1 | 11/2018 |

* cited by examiner

DISPLAY DEVICE WITH HIGHER SCREEN-TO-BODY RATIO

CROSS-REFERENCE TO RELATED APPLICATION

This application claims priority to and benefit of Korean Patent Application No. 10-2018-0082185 filed in the Korean Intellectual Property Office on Jul. 16, 2018 and PCT/KR2019/006436 filed on May 29, 2019, the entire contents of which are incorporated herein by reference.

BACKGROUND

(a) Technical Field

This disclosure relates to a display device.

(b) Description of the Related Art

Display devices such as an organic light emitting diode display and a liquid crystal display include a display panel on which a screen is positioned. Images are displayed on the screen. The display panels are manufactured by forming several layers and elements on a substrate.

Glass is used as the substrate of the display panel. However, the glass substrate has drawbacks of being heavy and fragile. In addition, because the glass substrate is rigid, it is difficult to bend the display panel. In recent years, a flexible display panel using a flexible substrate that is lightweight, strong against an impact, and easy to bend and straighten back out has been developed.

The display panel may have a display area in which most regions form the screen. However, a specific region of the display panel, for example an edge area, may be a non-display area in which a driving circuit, a signal line, etc. are disposed. Typically, the non-display area of the display panel is a limiting factor in increasing a screen-to-body ratio of the display device.

SUMMARY

A display device having an increased screen-to-body ratio is disclosed.

A display device according to an embodiment includes a display panel and a window laminated with the display panel. The display panel may include: a main panel region including a first side extending in a first direction and a second side extending in a second direction crossing the first direction; a first sub-panel region that is in contact with the first side and is bent; and a second sub-panel region that is in contact with the second side and is bent. A panel corner part of the main panel region adjacent to the first sub-panel region and the second sub-panel region is rounded.

In plan view, the panel corner part of the main panel region may be spaced apart from an intersection of an extending line of the first side in the first direction and an extending line in the second direction of the second side.

In plan view, a corner part of the display panel including the panel corner part of the main panel region may be rounded.

Each of main panel region, the first sub-panel region, and the second sub-panel region may include a display area and a non-display area. In plan view, the non-display area of the first sub-panel region, the non-display area of the main panel region, and the non-display area of the second sub-panel region may form a curved line that has no inflection point in the corner part of the display panel.

The window may include: a main window region including a first side extending in the first direction and a second side extending in the second direction; a first sub-window region in contact with the first side of the main window region; and a second sub-window region in contact with the second side of the main window region. In plan view, a window corner part of the main window region adjacent to the first sub-window region and the second sub-window region may be rounded.

In plan view, the corner part of the main window region may be spaced apart from an intersection of an extending line in the first direction of the first side of the main window region and an extending line in the second direction of the second side of the main window region.

The main window region may form a plane, and each of the first sub-window region and the second sub-window region may be bent.

In plan view, a corner part of the window including the window corner part of the main window region may be rounded.

The window, the display panel, or the window and the display panel may include a light blocking member at a position corresponding to the non-display area of the main panel region.

The first side and the second side of the main window region may respectively overlap the first side and the second side of the main panel region.

The main panel region may further include a third side extending in the first direction and a fourth side extending in the second direction. The display panel may further include a third sub-panel region that is in contact with the third side and is bent, and a fourth sub-panel region that is in contact with the fourth side and is bent.

At least one of the first to fourth sub-panel regions may include a first portion that is curved and a second portion that forms a plane.

A display device according to an embodiment includes a display panel and a window laminated with the display panel. The window includes: a main window region including a first side extending in a first direction and a second side extending in a second direction intersecting the first direction and forming a plane; a first sub-window region that is in contact with the first side and is bent; and a second sub-window region that is in contact with the second side and is bent. A window corner part of the main window region adjacent to the first sub-window region and the second sub-window region may be spaced apart from an intersection of an extending line in the first direction of the first side and an extending line in the second direction of the second side.

In plan view, a window corner part of the main window region may be rounded.

Each of the first sub-window region and the second sub-window region may include a curved surface.

In plan view, a corner part of the window including the window corner part of the main window region may be rounded.

The display device may further include a housing coupled to the window. When viewed from the front of the display device, the housing may be in contact with an edge of the corner part of the window.

The display panel may include a main panel region, a first sub-panel region in contact with the first side of the main panel region, and a second sub-panel region in contact with the second side of the main panel region. A panel corner part of the main panel region adjacent to the first sub-panel region and the second sub-panel region may non-overlap an intersection of an extending line in the first direction of a first side and an extending line in the second direction of a second side of the main panel region.

In plan view, a corner part of the display panel including the panel corner part of the main panel region may be rounded.

A display panel according to an embodiment includes: a main panel region including a first side extending in a first direction and a second side extending in a second direction intersecting the first direction; a first sub-panel region that is in contact with the first side and is bent around a bending axis parallel to the first side; and a second sub-panel region that is in contact with the second side and is bent around a bending axis parallel to the second side. In the display panel, a panel corner part adjacent to the first and second sides may be formed as a curved or straight line before bending of the first and second sub-panel regions, and may be formed in a curve after bending of the first and second sub-panel regions.

According to an embodiment, a display device having almost no bezel and a screen-to-body ratio close to 100% may be provided. In addition, the bezel may be reduced regardless of the bending curvature of the bending region. In addition, the corner parts of the display device and the edges of the corner parts of the screen are formed as a smooth curved line, which may increase the design sensitivity of the display device.

DETAILED DESCRIPTION OF THE EMBODIMENTS

Figure 1:
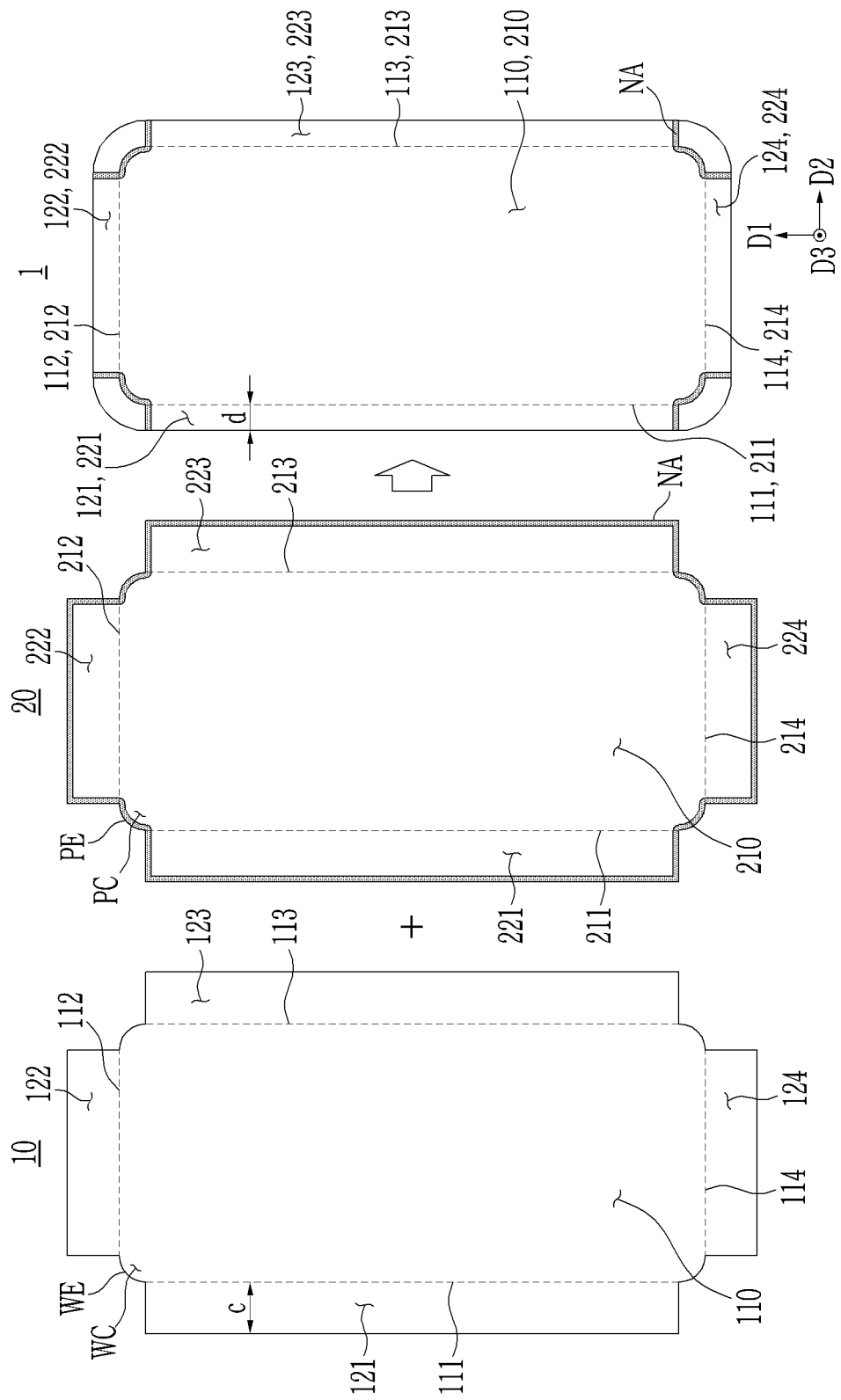
FIG. 1 is a plan view of a window that is built into a display device, a display panel, and a display device according to an embodiment.

The inventive concept will be described more fully hereinafter with reference to the accompanying drawings, in which embodiments of the inventive concept are shown. As those skilled in the art would realize, the described embodiments may be modified in various different ways, all without departing from the spirit or scope of the inventive concept.

Like reference numerals designate like elements throughout the specification. In the drawings, the thicknesses or sizes of respective layers and areas may be enlarged or reduced to clearly illustrate their arrangements and relative positions.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise", and variations such as "comprises" or "comprising", will be understood to imply the inclusion of stated elements but not the exclusion of any other elements.

Further, in the specification, the phrase "in a plan view" means when an object portion is viewed from the front of a display window or panel, and the phrase "in a cross-sectional view" means when a cross-section taken by vertically cutting an object portion is viewed from the side.

Now, a display device according to embodiments of the inventive concept is described in detail with reference to accompanying drawings.

Figure 2:
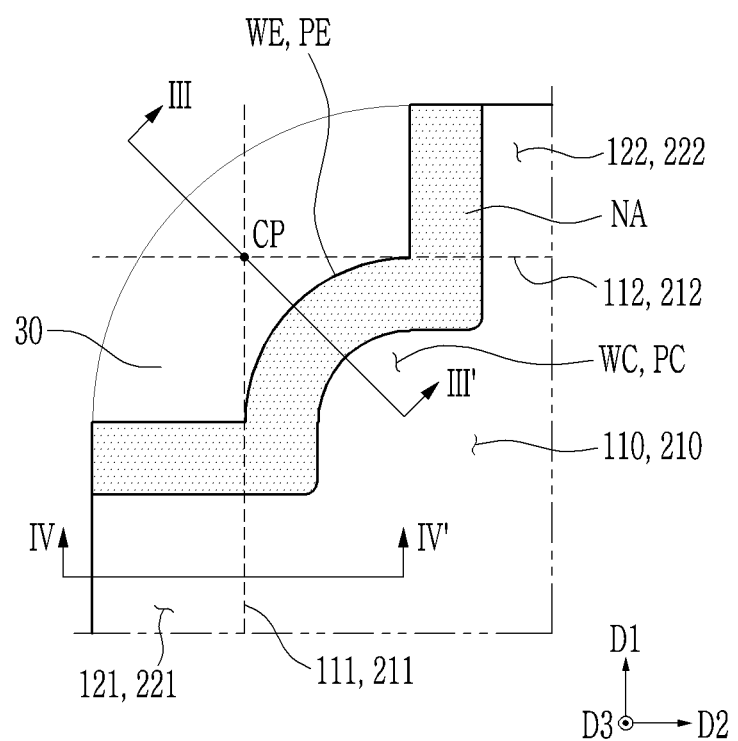
FIG. 2 is an enlarged view of one corner part of a display device shown in FIG. 1.
Figure 3:
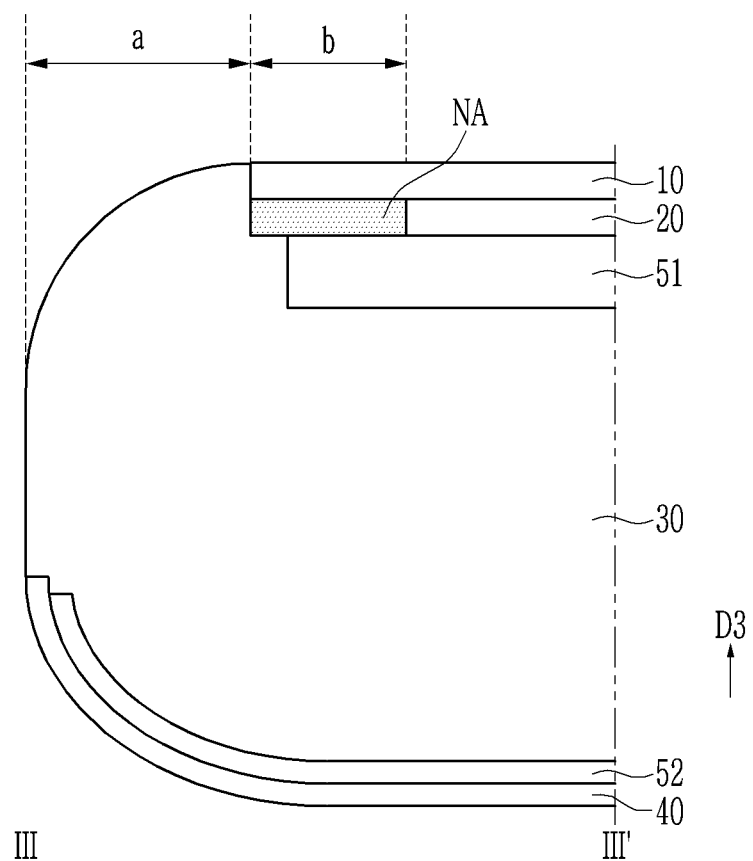
FIG. 3 is a cross-sectional view taken along line III-III' of FIG. 2.
Figure 4:
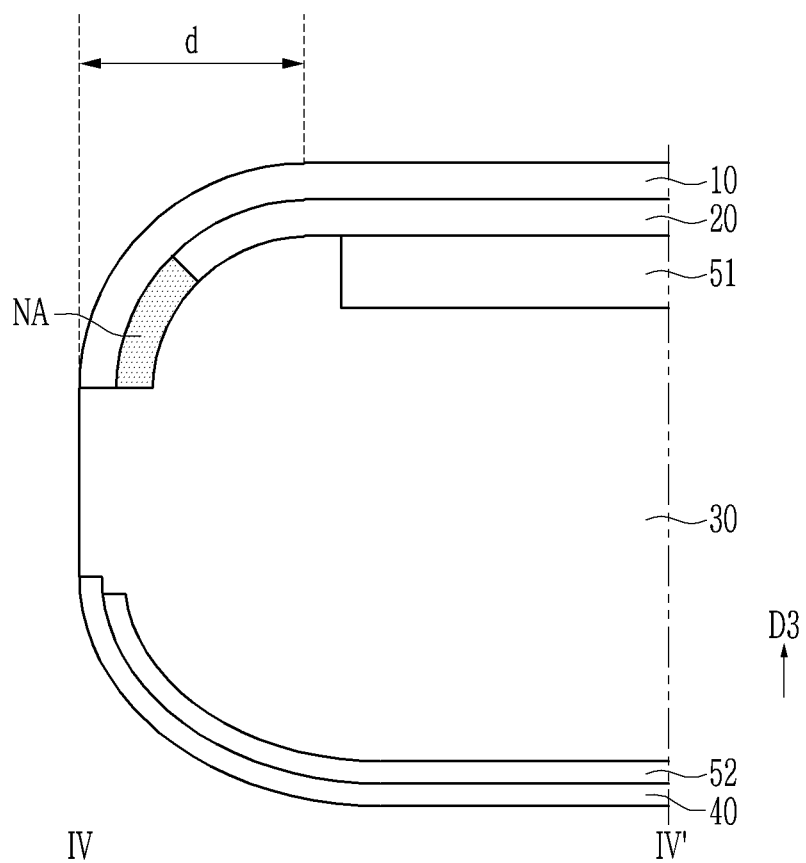
FIG. 4 is a cross-sectional view taken along line IV-IV' of FIG. 2.

FIG. 1 is a plan view of a window, a display panel, and a display device according to an embodiment. FIG. 2 is an enlarged view of one corner part of a display device shown in FIG. 1, FIG. 3 is a cross-sectional view taken along line III-III' of FIG. 2, and FIG. 4 is a cross-sectional view taken along line IV-IV' of FIG. 2.

Referring to FIG. 1, a window 10, a display panel 20, and a display device 1 are shown sequentially from the left. The window 10 and display panel 20 are shown in a state before bending and lamination. The display device 1 includes the window 10 and the display panel 20 laminated (e.g., bonded or attached) onto the window 10, and all four edge areas of the window 10 and the display panel 20 are bent. The display device 1 may be an electronic device such as a smartphone, a mobile phone, a tablet, a multimedia player, or a portable information terminal, or may be a module used for such an electronic device. Although not shown, less than all of four edge areas of the window 10 and the display panel 20 may not be bent in some cases.

The Window 10 is a kind of a cover that protects the display panel 20 from external impact. The window 10 provides support to maintain the bending state of the display panel 20. The window 10 is made of a transparent and hard material such as glass or plastic so as to view an image displayed on the screen of the display panel 20. The bending of the window 10 may be performed by thermoforming a glass plate or a plastic plate, for example.

The display panel 20 may be a light emission display panel including light-emitting elements. At least part of the display panel 20 may be flexible. The display panel 20 includes a display area corresponding to a screen on which the image is mostly displayed and a non-display area NA where the image is not displayed. Pixels are arranged in the display area, and the images are displayed by combinations of the pixels. In the display area, signal lines for transmitting signals to drive the pixels are arranged. For example, data signal lines transmitting data signals may extend in the first direction D1, and scan signal lines transmitting scan signals may extend in the second direction D2. Each pixel includes a transistor connected to the data signal line and the scan signal line, thereby receiving the data signal controlling a luminance of the pixel at predetermined timing.

The non-display area NA may be positioned near the edge of the display panel 20, and may be disposed to surround the display area. The non-display area NA is an area where circuits and/or wires for generating and/or transmitting various signals applied to the display area are disposed. In the non-display area NA, a pad part including pads for receiving signals from the display panel 20 or outputting signals to the outside of the display panel 20 may be disposed. For example, the pad part may be disposed in the non-display area NA of the upper side or lower side edges of the display panel 20, and a flexible printed circuit board (PCB) may be attached to the pad part.

In the display device 1, the window 10 and the display panel 20 are bent and laminated. For the lamination of the window 10 and display panel 20, an adhesive such as an optically clear adhesive may be used. Accordingly, an adhesive layer may be disposed between the window 10 and the display panel 20. The display panel 20 is laminated with the window 10 so that the surface where the screen is viewed faces the window 10.

Before the bending and lamination, the window 10 has a rectangular shape with corner parts cut out. When the shape of the window 10 is divided into regions, the window 10 includes a main window region 110, and a first sub-window region 121, a second sub-window region 122, a third sub-window region 123, and a fourth sub-window region 124 that are disposed in contact with the main window region 110.

The main window region 110 is approximately rectangular and contains four sides 111-114. The window edges WE of four window corner parts WC of the main window region 110 are formed to be rounded. The first and third sides 111 and 113 extend in the first direction D1, and the second and fourth sides 112 and 114 extend in the second direction D2. The first to fourth sub-window regions 121-124 are regions that are bent at a predetermined curvature with respect to the main window region 110. The first to fourth sides 111-114 of the main window region 110 become a reference line for bending the first to fourth sub-window regions 121-124 with respect to the main window region 110. The first to fourth sides 111-114 of the main window region 110 are bending start lines of the first to fourth sub-window regions 121-124, and hereinafter are simply referred to as bending lines. In the main window region 110, in addition to an approximate rectangle in which the edges of the corner parts are rounded, it may be an approximate polygon with the corner parts rounded.

Before the bending and lamination, the display panel 20 has a rectangular shape with corner parts cut out. When the shape of the display panel 20 is divided into regions, the display panel 20 includes a main panel region 210, and a first sub-panel region 221, a second sub-panel region 222, a third sub-panel region 223, and a fourth sub-panel region 224 that are disposed in contact with the main panel region 210.

The main panel region 210 is an approximate rectangle, and includes four sides 211-214. The panel edges PE of four panel corner parts PC of the main panel region 210 are formed to be rounded. The first side and the third side 211 and 213 extend in the first direction D1, and the second side and the fourth side 212 and 214 extend in the second direction D2. The first to fourth sub-panel regions 221-224 are regions that are bent by the predetermined curvature with respect to the main panel region 210. The first to fourth sides 211-214 of the main panel region 210 become a reference line for bending the first to fourth sub-panel regions 221-224 with respect to the main panel region 210. The first to fourth sides 211-214 of the main panel region 210 are bending start lines of the first to fourth sub-panel regions 221-224, and hereinafter are simply referred to as bending lines. In the main panel region 210, in addition to an approximate rectangle in which the edges of the corner parts are rounded, it may be an approximate polygonal shape with the corner parts rounded.

The window 10 and the display panel 20 may have substantially the same shape and size. The window 10 may be slightly larger than the display panel 20 overall or in a specific region. After bending the first to fourth sub-window regions 121-124 of the window 10, the display panel 20 may be laminated to the window 10. During the lamination of the display panel 20, the first to fourth sub-panel regions 221-224 of display panel 20 may be bent. Alternatively, the display panel 20 may be laminated to the window 10 in the state in which the first to fourth sub-panel regions 221-224 are bent.

Referring to FIG. 1 to FIG. 4, when the window 10 and the display panel 20 are laminated, the first to fourth sub-window regions 121-124 of the window 10 and the first to fourth sub-panel regions 221-224 of the display panel 20 are bent. The first sub-window region 121 is bent around a bending axis parallel to the first side 111, the second sub-window region 122 is bent around a bending axis parallel to the second side 112, the third sub-window region 123 is bent around a bending axis parallel to the third side 113, and the fourth sub-window region 124 is bent around a bending axis parallel to the fourth side 114. The first sub-panel region 221 is bent around a bending axis parallel to the first side 211, the second sub-panel region 222 is bent around a bending axis parallel to the second side 212, the third sub-panel region 223 is bent around a bending axis parallel to the third side 213, and the fourth sub-panel region 224 is bent around a bending axis parallel to the fourth side 214.

The bending axis of the first sub-window region 121 and the bending axis of the first sub-panel region 221 may be the same. The bending axis of the second sub-window region 122 and the bending axis of the second sub-panel region 222 may be the same. The bending axis of the third sub-window region 123 and the bending axis of the third sub-panel region 223 may be the same. The bending axis of the fourth sub-window region 124 and the bending axis of the fourth sub-panel region 224 may be the same. The first to fourth sides 111-114 of the main window region 110 may overlap with the first to fourth sides 211-214 of the main panel region 210, and they may be matched in plan view.

In the window 10, with respect to the boundary of the first to fourth sides 111-114 of the main window region 110, the inner main window region 110 is a plane surface that is not bent, and the outer first to fourth sub-window regions 121-124 are curved surfaces that are bent. Likewise, in the display panel 20, with respect to the boundary of the first to fourth sides 211-214 of the main panel region 210, the inner main panel region 210 is a plane surface that is not bent, and the outer first to fourth sub-panel regions 221-224 are curved surfaces that are bent. A width d of the first to fourth sub-window regions 121-124 after bending is narrower than a width c of the first to fourth sub-window regions 121-124 before bending. For example, the width d may be about ⅕ to about ⅘, about ¼ to about ¾, or about ⅓ to about ⅔ of the width c.

In the first to fourth sub-panel regions 221-224, for example as shown in FIG. 4, the non-display area NA positioned at each edge of the sub-panel regions 221-224 may be bent so as to not be visible or to be almost invisible from the front of display device 1. However, since the main panel region 210 is not bent, the non-display area NA positioned at the edge portions of the panel corner parts PC of the main panel region 210 may be visible from the front.

Like the present embodiment, if the display panel 20 and the window 10 protecting the display panel 20 and the first to fourth sub-window regions 121-124 and the first to fourth the sub-panel regions 221-224 are bent, in plan view of the display device 1, the non-display area NA of the display panel 20 is only shown in a specific region. That is, the non-display area NA may be seen in the edge portions of the four panel corner parts PC of the main panel region 210 of the display panel 20 and the edge portions of the first to fourth the sub-panel regions 221-224 adjacent thereto, and in the remaining regions, the non-display area NA may not be visible or may be barely visible. Therefore, the screen may occupy most of the region to be visible when viewing the display device 1 from the front, and the screen-to-body ratio (a screen to surface ratio) of the display device 1 may be increased.

The display device 1 may include a light blocking member disposed at the region corresponding to the non-display area NA of the display panel 20, and the light blocking member may be disposed at the window 10 and/or the display panel 20. As described above, elements such as circuits, wirings, and pads may be disposed in the non-display area NA. The light blocking member serves to block the elements of the non-display area NA from being visible or to prevent external light, that is, light incident to the display device 1 from the outside, from being reflected. The light blocking member may be disposed between display panel 20 and the window 10 or may be disposed inside display panel 20. The light blocking member may be referred to as a black matrix, a printing layer, or the like.

The window edges WE of the window corner parts WC of the main window region 110 are formed to be rounded. The panel edges PE of the panel corner parts PC of the main panel region 210 are also formed to be rounded. The window edges WE of the window corner parts WC of the main window region 110 may match the panel edges PE of the panel corner parts PC of the main panel region 210. In contrast, the window corner parts WC are formed larger than the panel corner parts PC, so that the window edges WE may be disposed farther from the center of the display device 1 than the panel edges PE.

Since the edges of the corner parts of the screen corresponding to the panel corner parts PC of the main panel region 210 are formed to be rounded, the user may see the image displayed on the screen more comfortably and increase design sensitivity of the display device 1.

Each panel corner part PC of the main panel region 210 may not overlap with an intersection (or cross point) CP of extending lines of the adjacent sides of the first to fourth sides 211-214 of the main panel region 210. FIG. 2, which is an enlarged view of the upper left corner part of the display device 1, shows the extending line III-III' of the first side 211 and the extending line III-III' of the second side 212 together. Referring to FIG. 2, the panel corner part PC between the first side 211 and the second side 212 of the main panel region 210 does not overlap the intersection CP of the extending line in the first direction D1 of the first side 211 and the extending line in the second direction D2 of the second side 212, and is spaced apart (or separated) from the intersection CP. When the panel corner part PC of the main panel region 210 is formed in this way, the bending of the first sub-panel region 221 and the second sub-panel region 222 bending around different bending axes does not affect the panel corner part PC of the main panel region 210. Therefore, the stress of the panel corner part PC of the main panel region 210 may be prevented, and damage to the circuits, the wirings, the pixels, and the like disposed on the panel corner part PC may be prevented.

The laminate of the display panel 20 and the window 10 is coupled to the housing 30. The housing 30 is a frame that serves to accommodate and fix the laminate of the display panel 20 and the window 10 and may be made of materials such as metal and plastic. When the display device 1 is a mobile electronic device such as a smartphone, a controller, a memory, a communication module, a camera, an audio input and output device, a circuit board, a battery, etc. may be disposed inside the housing 30 or may be combined with the housing 30. On the back of the display device 1, a cover 40 may be coupled to the housing 30, and functional sheets such as waterproof tapes 51 and 52 may be disposed between the display panel 20 and the housing 30 and/or between the cover 40 and the housing 30.

In plan view (as in FIG. 2), the housing 30 may be invisible or barely visible in the region except for the four corner parts of the display device 1. This is because the housing 30 is covered by the first to fourth sub-window regions 121-124 of the window 10 in such a region. However, in the corner parts of the display device 1, the housing 30 is disposed in the space between the adjacent first to fourth sub-window regions 121-124, so that the edges of the corner parts of the display device 1 may be formed as a whole to be smooth and rounded.

The width a of the housing 30 seen from the corner parts of the display device 1 may be the same as or almost the same as the width d of the first to fourth sub-window regions 121-124 after bending. The width a of the housing 30 (see FIG. 3) becomes a bezel of the display device 1 together with the width b of the non-display area NA near the edge of the panel corner parts PC of the main panel region 210. In this specification, the bezel may mean a region disposed outside the screen without composing the screen in plan view of the display device 1 and may be referred to as a dead space. Therefore, there is little or no bezel in the region except for the corner parts of the display device 1, however in the corner parts of the display device 1, as shown for example, there may be the bezel that has the width corresponding to the sum of the width b of the non-display area NA and the width a of the housing 30 and an approximate brow shape or a shape of a donut cut into quarters.

Figure 5:
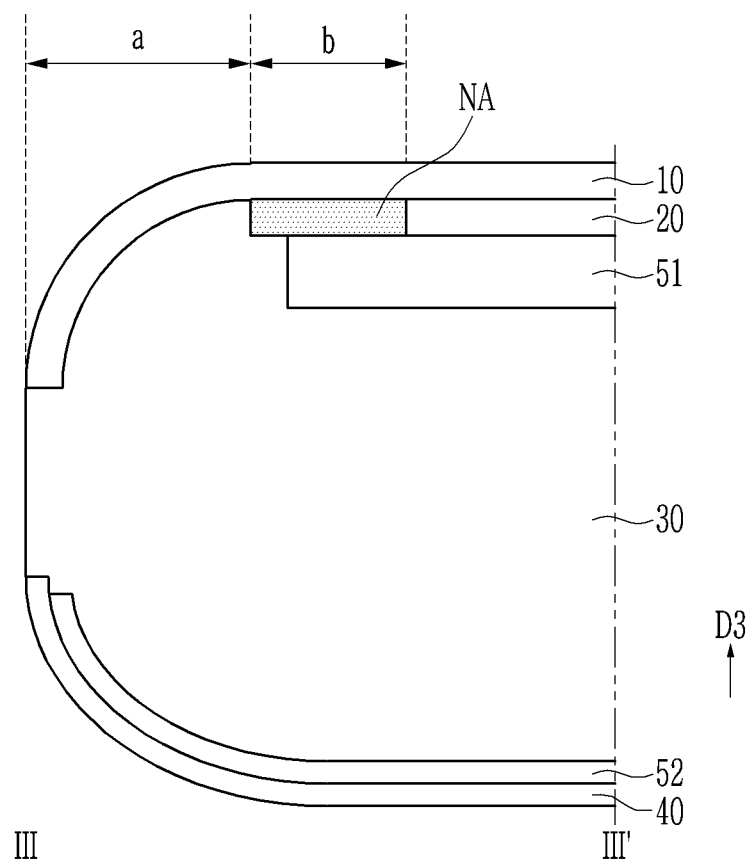
FIG. 5 is a cross-sectional view of a part corresponding to a line III-III' of FIG. 2 in a display device according to an embodiment.

Referring to FIG. 5, a different example of the structure of the corner parts of the display device 1 from the above-described embodiment is shown. For example, referring to FIG. 2 and FIG. 3, in the corner part of the display device 1, the housing 30 is disposed in the space between the adjacent first sub-window region 121 and second sub-window region 122 and the housing 30 is exposed in the front. In contrast, in the embodiment of FIG. 5, the window 10 is formed to cover the housing 30 in the corresponding region. Therefore, in plan view of the display device 1, the corner parts of the display device 1 are covered by the window 10, and the border of the display device 1 and the border of the window 10 may coincide or almost coincide. Even if the window 10 is formed like this, the display area of the display panel 20 is not positioned in the corner parts of the display device 1, so the corresponding regions are still the bezel. However, in plan view of the display device 1, since all surfaces are covered by the window 10, a smoother front surface may be formed.

Until now, the embodiments in which there is little or no bezel in the regions other than the corner parts of the display device 1 were described. Hereinafter, an embodiment in which the corner parts of the display device 1 have almost no bezel is described. In order to avoid the complexity of the specification, the descriptions of the same configurations and features as those of the above-described embodiment are simplified or omitted.

Figure 6:
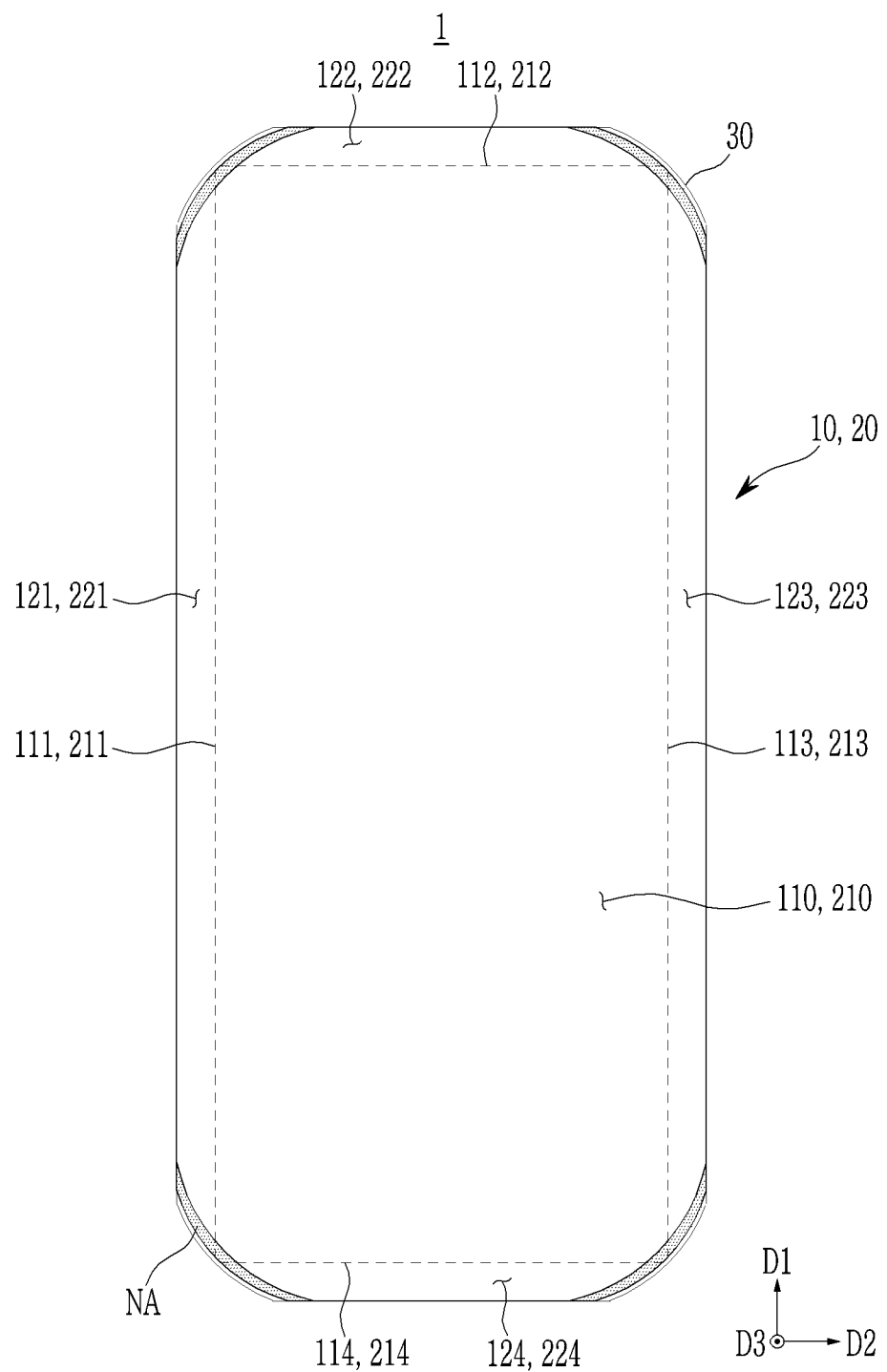
FIG. 6 is a plan view of a display device according to an embodiment.
Figure 7:
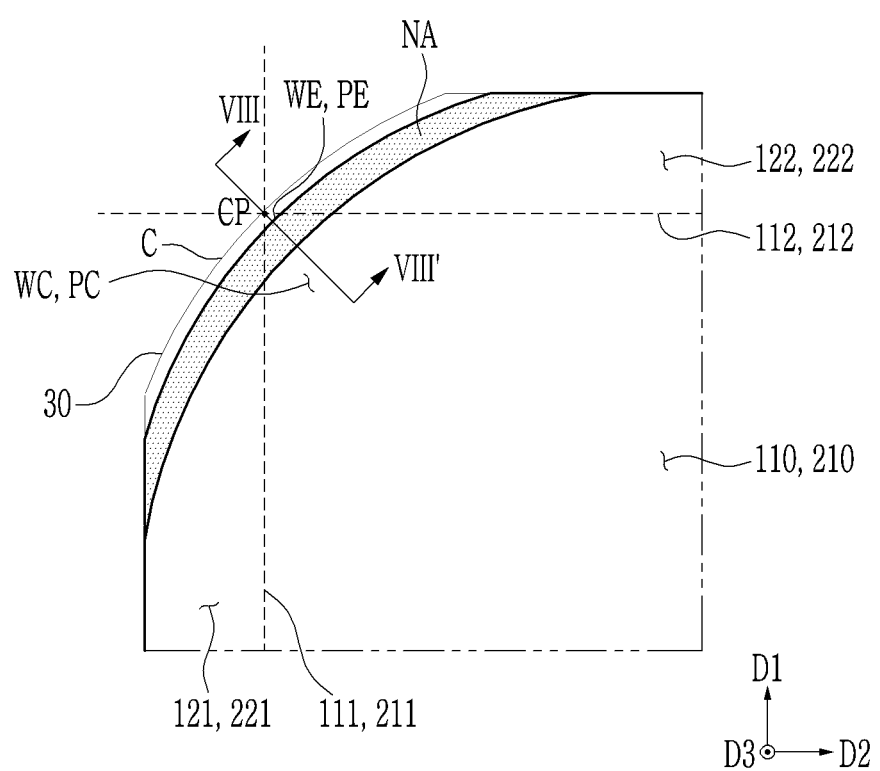
FIG. 7 is an enlarged view of one corner part of a display device shown in FIG. 6.
Figure 8:
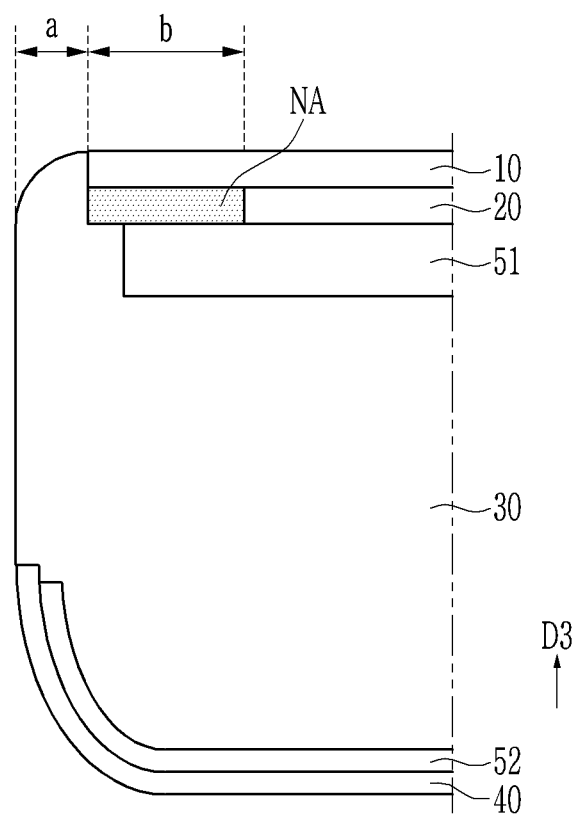
FIG. 8 is cross-sectional view taken along a line VIII-VIII' of FIG. 7.

FIG. 6 is a plan view of a display device according to an embodiment, FIG. 7 is an enlarged view of one corner part of a display device shown in FIG. 6, and FIG. 8 is cross-sectional view taken along a line VIII-VIII' of FIG. 7.

Referring to FIG. 6 to FIG. 8, the display device 1 includes the window 10 and the display panel 20 which are bent and laminated, and the housing 30.

The window 10 includes the main window region 110, and the first to fourth sub-window regions 121-124, which are disposed in contact with the first to fourth sides 111-114 of the main window region 110, respectively, and are bent with a predetermined curvature. The first and third side 111 and 113 of the main window region 110 extend in the first direction D1, and the second fourth sides 112 and 114 extend in the second direction D2. The first to fourth sides 111-114 are the bending lines of the first to fourth sub-window regions 121-124. The window edges WE of the window corner parts WC in the main window region 110 are formed to be rounded with a predetermined curvature.

The display panel 20 includes the main panel region 210 and the first to fourth sub-panel regions 221-224, which are disposed in contact with the first to fourth sides 211-214 of the main panel region 210, respectively, and are bent with a predetermined curvature. The first and third sides 211, and 213 of the main panel region 210 extend in the first direction D1, and the second and fourth sides 212 and 214 extend in the second direction D2. The first to fourth sides 211-214 are the bending lines of the first to fourth sub-panel regions 221-224. The panel edges PE of the four panel corner part PCs of the main panel region 210 are formed to be rounded with a predetermined curvature.

The window 10 and the display panel 20 may have substantially the same shape and size. The window edges WE of the window corner parts WC of the main window region 110 may match the panel edges PE of the panel corner parts PC of the main panel region 210. Although not explicitly shown, the window edges WE of the window corner parts WC of the main window region 110 may be slightly larger than the panel edges PE of the panel corner parts PC of the main panel region 210. The first to fourth sides 111-114 of the main window region 110 may overlap with the first to fourth sides 211-214 of the main panel region 210, and they are flush in plan view.

In the window 10, with respect to the boundaries of the first to fourth sides 111-114 of the main window region 110, the inner main window region 110 is the plane surface that is not bent, and the outer first to fourth sub-window regions 121-124 are the curved surface that is bent based on the bending axis parallel to the first to fourth sides 111-114. Similarly, when the display panel 20 borders the first to fourth sides 211-214 of the main panel region 210, the inner main panel region 210 is the unbent plane, and the outer first to fourth the sub-panel regions 221-224 are the curved surface bent around the bending axes parallel to the first to fourth sides 211-214.

The first to fourth sub-window regions 121-124 may be generally curved, but the portions adjacent to the first to fourth sides 111-114 may be the curved surface and the portions far from the first to fourth sides 111-114 may be the plane surface. The first to fourth sub-panel regions 221-224 may be entirely curved, but the portions adjacent to the first to fourth sides 211-214 may be the curved surface and the portions farther from the first to fourth sides 211-214 may be the plane surface.

The non-display area NA disposed on the edge of display panel 20 is invisible or almost invisible from the front of the display device 1 because the first to fourth sub-panel regions 221-224 of the display panel 20 are bent. In plan view, in the corner parts of the display device 1, the edge of one corner part of the main panel region 210 and the edges of the adjacent sub-panel regions among the first to fourth sub-panel regions 221-224 form a single curved line without an inflection point. In addition, the non-display area NA disposed on the edge of one corner part of the main panel region 210 and the non-display area NA disposed on the edges of the adjacent sub-panel regions among the first to fourth sub-panel regions 221-224 form a curved line without the inflection point. For example, referring to FIG. 7, the panel edge PE of the upper-left panel corner part PC of the main panel region 210 and the edges of the first sub-panel region 221 and the second sub-panel region 222 adjacent thereto form one curved line C. Therefore, the edges of the corner parts of the display device 1 are formed to be rounded. Also, the non-display area NA forms the curved line of a predetermined width b over the panel edge PE of the upper-left panel corner part PC of the main panel region 210 and the edges of the first sub-panel region 221 and the second sub-panel region 222 adjacent thereto.

In the embodiment of FIG. 1, in the corner parts of the display device 1, the edges of the display panel 20 are not connected by one curved line, but are connected by a straight line, a curved line (or an arc), and a straight line. The screen of the display panel 20, which is limited by these edges, is not smooth in the corner parts and has a slight sense of incongruity. In the present embodiment, the edges are connected to one curved line in the corner parts of the display panel 20, and the edges of the corner parts of the screen of display panel 20 are formed to be rounded. Therefore, the image displayed on the screen may be viewed comfortably without being awkward, and the design sensitivity of the display device 1 may be further increased.

On the corner parts of the display device 1, a portion of the housing 30 that fixes the laminate of the window 10 and the display panel 20 may be seen from the front of the display device 1. However, in the present embodiment, there is no space between adjacent first to fourth sub-window regions 121-124, so there is no need for the housing 30 to fill the space. Since the first to fourth sub-window regions 121-124 in the corner parts of the display device 1 form the smooth and rounded edge, there is no need to thicken the width a of the housing 30 visible from the front, and it may be formed with the minimum width required for combining with the window 10, for example, as thin as less than 0.5 mm or less than 0.3 mm. Therefore, even if the bezel exists in the four corner parts of the display device 1, the width (approximately a+b) of the bezel may be dramatically reduced (e.g., less than about 2 mm, less than about 1.5 mm, or less than about 1 mm), and the screen-to-body ratio of the display device 1 may be increased to close to 100%. The part of the housing 30 constituting the bezel may be in close contact with the corner parts of the window 10, and may be formed to be rounded like the round edges of the corner parts of the window 10 in plan view.

On the other hand, the housing 30 may not be visible from the front, and only the non-display area NA of the display panel 20 or the region of the window 10 covering the non-display area NA of the display panel 20 may be designed to be the bezel.

FIG. 7 shows an intersection CP where an extension of two adjacent sides among the first to fourth sides 211-214 of the main panel region 210 meet each other. None of the panel corner parts PC of the main panel region 210 coincides with the intersection CP. For example, referring to FIG. 7, the panel corner part PC between the first side 211 and the second side 212 of the main panel region 210 does not coincide with the intersection CP where the first side 211 would meet the second side 212 if they were extended in the first direction D1 and the second direction D2, respectively. In other words, the panel corner part PC is spaced apart from the intersection CP. The distance between the edge of the panel corner part PC and the intersection CP may vary depending on the shape of the corner part PC, but is greater than zero (0). When the panel corner part PC of the main panel region 210 is formed in this way, the bending of the first sub-panel region 221 and the second sub-panel region 222 bending around the different bending axes does not affect the panel corner part PC of the main panel region 210. Therefore, the stress of the panel corner part PC of the main panel region 210 may be prevented, and the damage of the circuit, wiring, pixels, and the like disposed on the panel corner part PC may be prevented. In addition, since the panel corner part PC of the main panel region 210 may be formed regardless of the bending curvature of the first sub-panel region 221 and the second sub-panel region 222, the design freedom of the panel corner part PC is increased. The explanation uses the upper left panel corner part PC of the main panel region 210 as an example, but the configuration applies to one or more of the upper right, lower left, and lower right corner parts of the main panel region 210.

In some embodiments, similarly to the main panel region 210, each window corner part WC of the main window region 110 may not coincide with the intersection CP where the adjacent sides of the first to fourth sides 111-114 of the main window region 110 would meet if extended. However, in other embodiments, the window 10 may include a region overlapping the intersection CP of the extending line of the adjacent sides. Unlike the display panel 20, the window 10 does not include elements such as circuits, wirings, and pads, so there is no risk of damage to such elements even if the biaxial bending at the intersection CP occurs, and this is because the window 10 may be molded three-dimensionally near the intersection CP.

The housing 30 may or may not coincide with the intersection CP of the extending lines of the adjacent sides among the first to fourth sides 111-114 of the main window region 110. FIG. 7 depicts the case where the housing 30 does coincide with the intersection CP.

As shown above, the display device 1 of which the edges of the corner parts are rounded and has almost no bezel may be formed. FIG. 9 to FIG. 14 describe examples of different shapes of the window 10 and the display panel 20 before bending.

Figure 9:
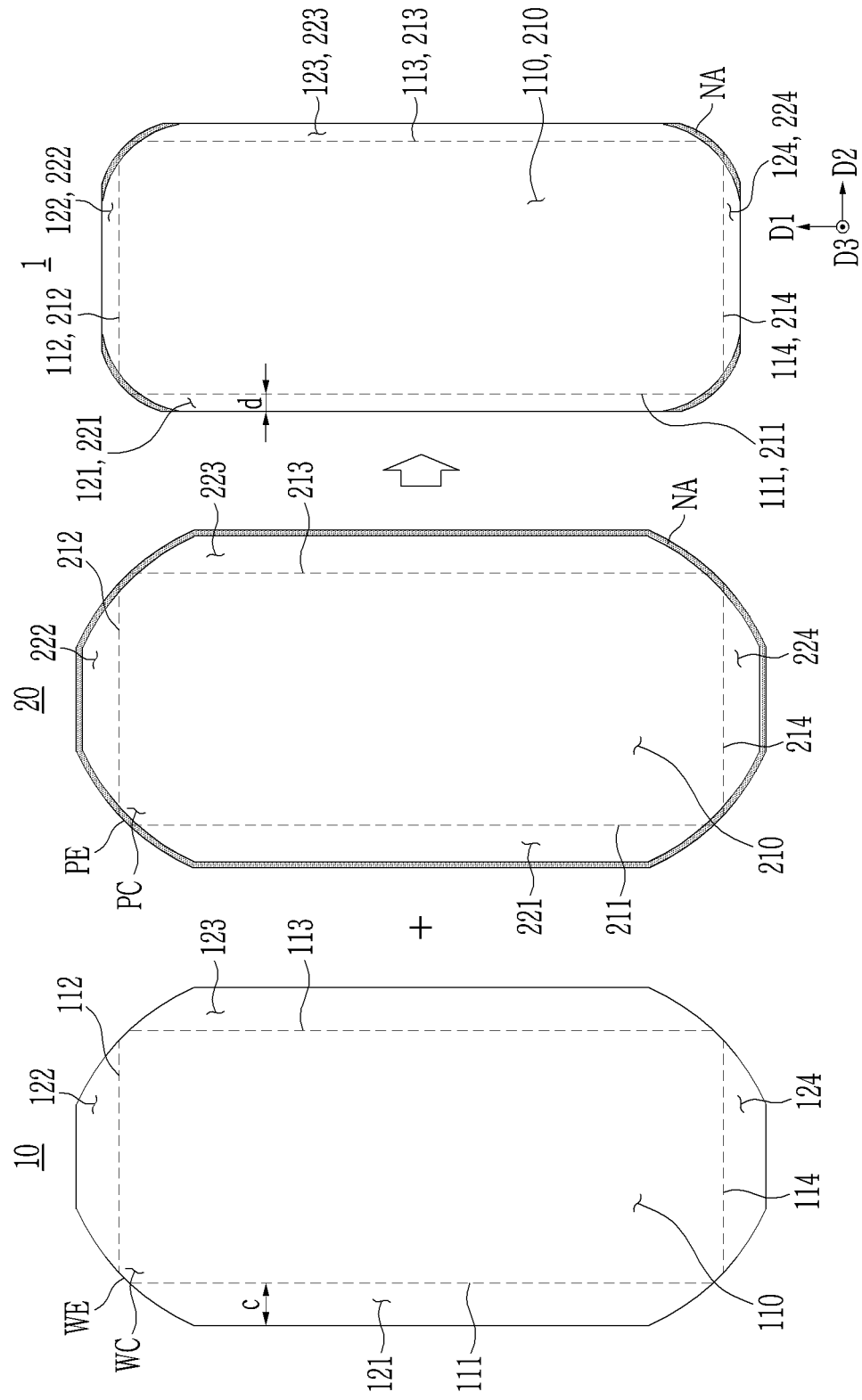
FIG. 9 is a plan view of a window configuring a display device, a display panel, and a display device according to an embodiment.

FIG. 9 is a plan view of a window that is built into a display device, a display panel, and a display device according to an embodiment.

Referring to FIG. 9, in the state that the window 10 and the display panel 20 are laminated, in plan view, the display device 1 is approximately rectangular, but the edges of the corner parts are rounded. The housing that may be combined with the laminate of the display panel 20 and the window 10 may not be visible from the front, and if the size of the window 10 and the display panel 20 is the same, only the non-display area NA of the display panel 20 exists as the bezel in the corner parts of the display device 1.

The window 10 and the display panel 20 before bending and lamination are the approximate rectangle as a whole, but the edges of the corner parts are rounded. For example, the window edge WE of one window corner part WC of the main window region 110 and the edges of the first sub-window region 121 and second sub-window region 122 adjacent thereto form a curved line (or an arc) without an inflection point. In addition, the panel edge PE of one panel corner part PC of the main panel region 210 and the edges of the first sub-panel region 221 and the second sub-panel region 222 adjacent thereto form a curved line (or the arc) without an inflection point. The window edges WE of the window corner parts WC of the main window region 110 are rounded and the panel edges PE of the panel corner parts PC of the main panel region 210 are also rounded. The window 10 and the display panel 20 may have the same shape and size. The window 10 may be slightly larger than the display panel 20.

Because the edges of the corner parts of the display panel 20 are rounded, even if the width of the screen of the display panel 20 (in the display panel 20, the width in the second direction D2 of the region excluding the non-display area NA) changes to the first direction D1, it gradually decreases or increases without a rapid change. For example, as shown in the embodiment of FIG. 1, if the width of the screen changes rapidly in the corner part of the display panel 20, a load of the signals (e.g., a scan signal, a light emission control signal, and the like) applied to the pixels changes rapidly in the region of the rapid change of the width so that spots may occur in the image displayed on the screen. That is, a luminance difference may occur in a region before and in a region after the boundary of a line in which the width of the screen changes rapidly, and the luminance difference may be recognized as a spot. According to the present embodiment, since the width of the screen may be gradually changed to correspond to the shape of the display panel 20, even if the difference in luminance occurs in the region where the width of the screen changes, the difference in luminance is gradual so that it is not recognized as a spot. Therefore, it is possible to provide the display device 1 in which the display is not deteriorated while minimizing the bezel.

Figure 10:
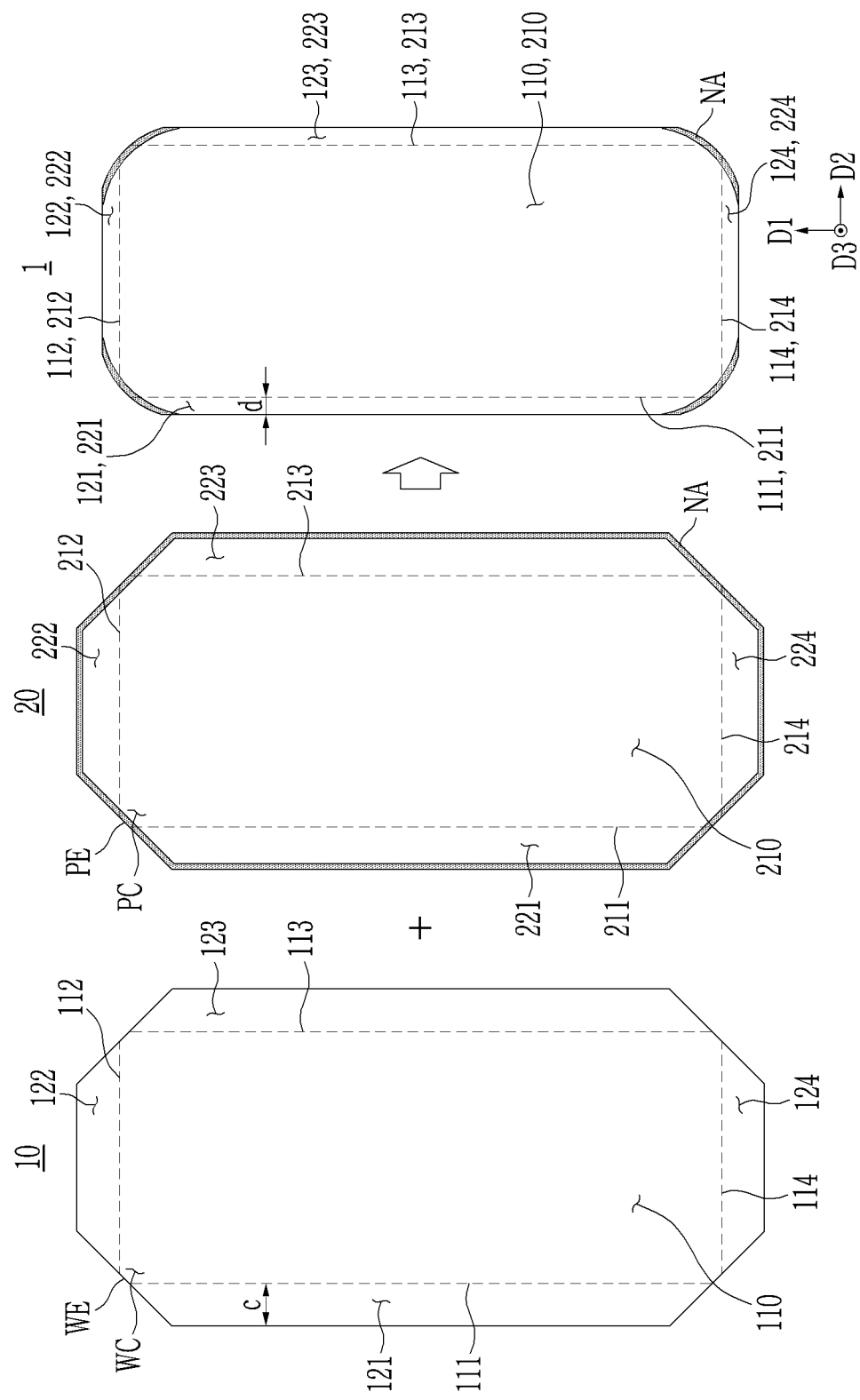
FIG. 10 is a plan view of a window configuring a display device, a display panel, and a display device according to an embodiment.

FIG. 10 is a plan view of a window that is built into a display device, a display panel, and a display device according to an embodiment.

Referring to FIG. 10, in the state before the bending and lamination, the window 10 and the display panel 20 are the same as the shape remaining after cutting the corner parts from the rectangle into a triangle like chamfering, and the overall shape is approximately octagonal. In other words, the window 10 and the display panel 20 are overall rectangular, but four corner parts are cut diagonally. For example, one window corner part WC of the main window region 110 and the edges of the first sub-window region 121 and the second sub-window region 122 adjacent thereto form a straight line. In addition, one panel corner part PC of the main panel region 210 and the edges of the first sub-panel region 221 and the second sub-panel region 222 adjacent thereto form a straight line.

In the main panel region 210, the panel edges PE of the panel corner parts PC are formed in a straight line, and the first to fourth sub-panel regions 221-224 may be equilateral trapezoids. In the main window region 110, the window edges WE of the window corner parts WC are formed in a straight line, and the first to fourth sub-window regions 121-124 may be equilateral trapezoids. The window 10 may have the same shape as the display panel 20, and may be the same as the display panel 20 or slightly larger than the display panel 20.

Since the edges of the corner parts of the display panel 20 are formed in an oblique straight line, even if the width of the screen of the display panel 20 changes in the first direction D1, the width does not change rapidly but gradually decreases or increases. Therefore, similar to the embodiment of FIG. 9, even if a luminance difference occurs in the region where the width of the screen is changed, the luminance difference is gradually increased or decreased, so that the luminance difference is not recognized as a spot.

Even if the edges of the corner parts of the window 10 and the display panel 20 are straight lines before being bent, they appear round when viewed from the front after bending. Therefore, in the state that the window 10 and the display panel 20 are laminated, in plan view, similarly to the embodiment of FIG. 9, the display device 1 is approximately rectangular and the edges of the corner parts may be formed to be rounded. The overall shape and the bezel of the display device 1 are the same as described in the embodiment of FIG. 9.

Figure 11:
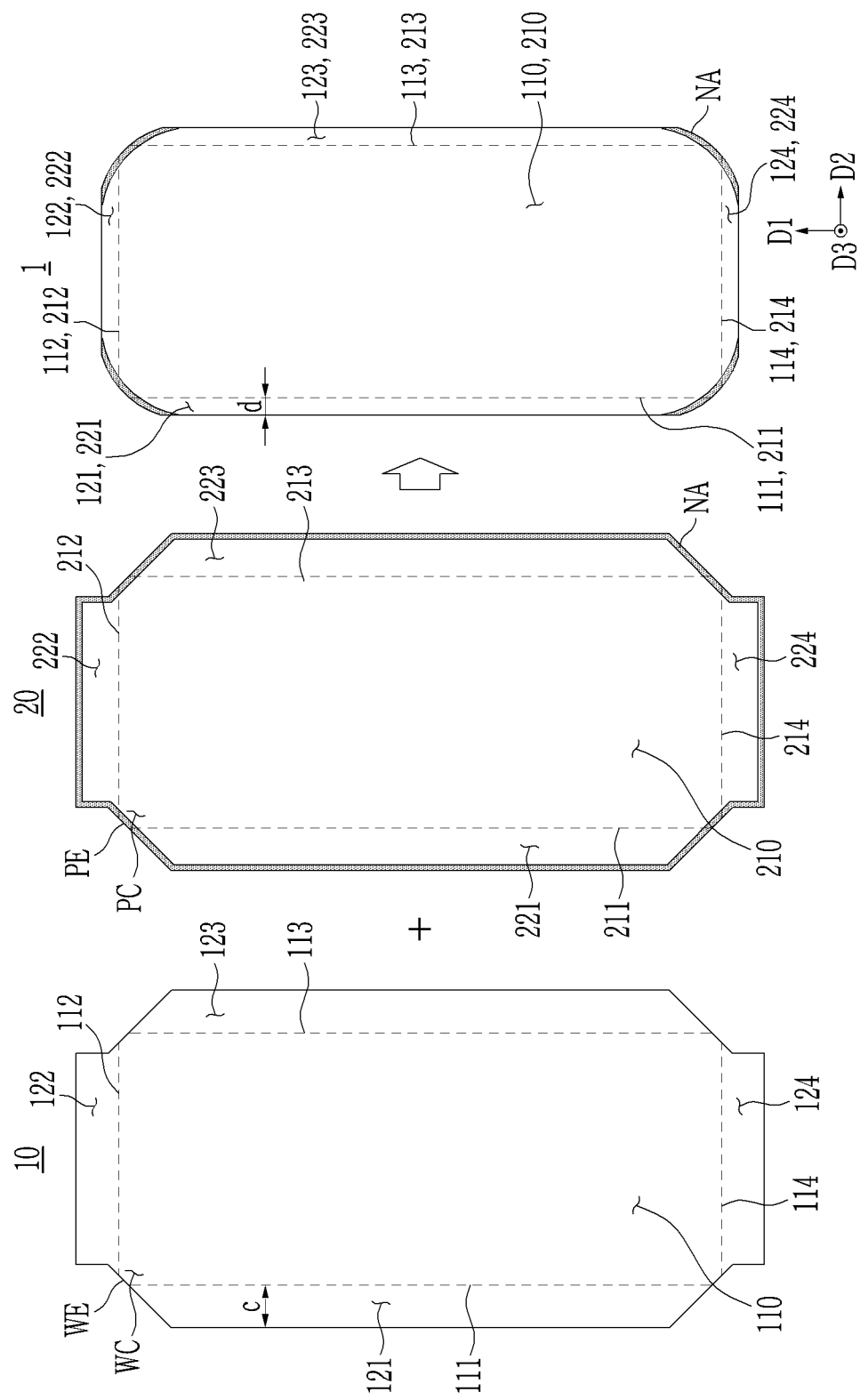
FIG. 11 is a plan view of a window configuring a display device, a display panel, and a display device according to an embodiment.
Figure 12:
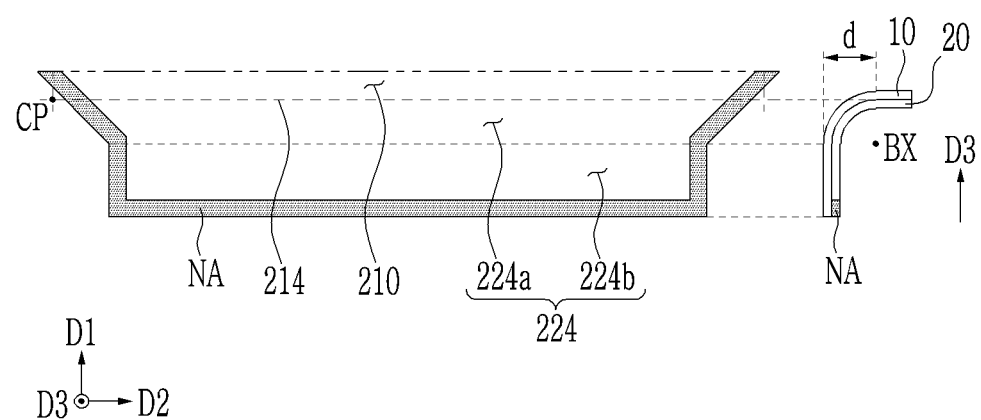
FIG. 12 is an enlarged view before bending and a cross-sectional view after bending for a lower region in a display panel in FIG. 11.

FIG. 11 is a plan view of a window that is built into a display device, a display panel, and a display device according to an embodiment, and FIG. 12 is an enlarged view before bending and a cross-sectional view after bending for a lower region in a display panel in FIG. 11. In FIG. 12, the cross-sectional view after the bending also shows the window.

Referring to FIG. 11 and FIG. 12, in the state before the bending and lamination, the window 10 and the display panel 20 have the shape that would remain after cutting the corner parts off a rectangle. In the case of the embodiment of FIG. 10, the first to fourth sub-panel regions 221-224 are equilateral trapezoids. In the present embodiment of FIG. 11 and FIG. 12, the first and third sub-panel regions 221 and 223 are equilateral trapezoids, and the second and fourth sub-panel regions 222 and 224 have widths that may first gradually decrease with distance from the second and fourth sides 212 and 214 and then remain constant. For example, the fourth sub-panel region 224 includes a first portion 224a, which is an equilateral trapezoid, and a second portion 224b, which is a rectangle. A pad part may be disposed in the non-display area NA of the second portion 224b. In this way, if the second portion 224b having a constant width is formed, it may be advantageous to secure an area in which the pad part and the signal lines connected to the pad part are disposed, for example.

After bending of the display panel 20, the first portion 224a of the fourth sub-panel region 224 may be a curved surface bent around the bending axis BX, and the second portion 224b may be a plane parallel to the third direction D3. In the cross-sectional diagram of FIG. 12, the curved line formed by the first portion 224a may be an arc corresponding to about a quarter of the circle centered on the bending axis BX. Accordingly, the screen of the second portion 224b may be perpendicular to the screen of the main panel region 210, and the non-display area NA of the second portion 224b may not be visible from the front of the display device 1. In addition, in the state that the window 10 and display panel 20 are laminated, when viewing the display device 1 from the front, it is an approximate rectangle and the edges of the four corner parts may be rounded. The housing of the display device 1 may not be visible from the front, and if the sizes of the window 10 and the display panel 20 are the same, only the non-display area NA of the display panel 20 exists as the bezel in the corner parts of the display device 1.

Figure 13:
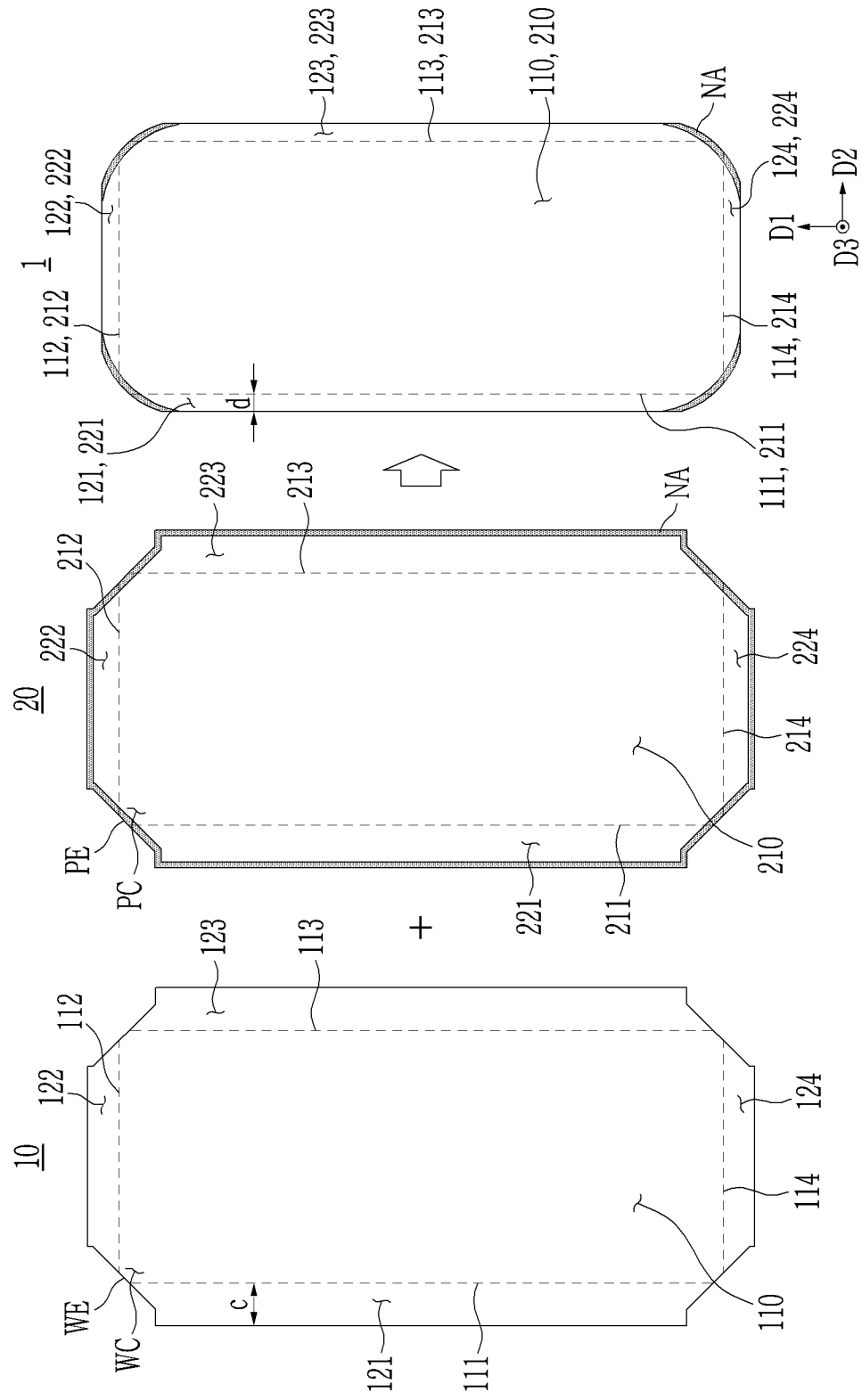
FIG. 13 is a plan view of a window configuring a display device, a display panel, and a display device according to an embodiment.
Figure 14:
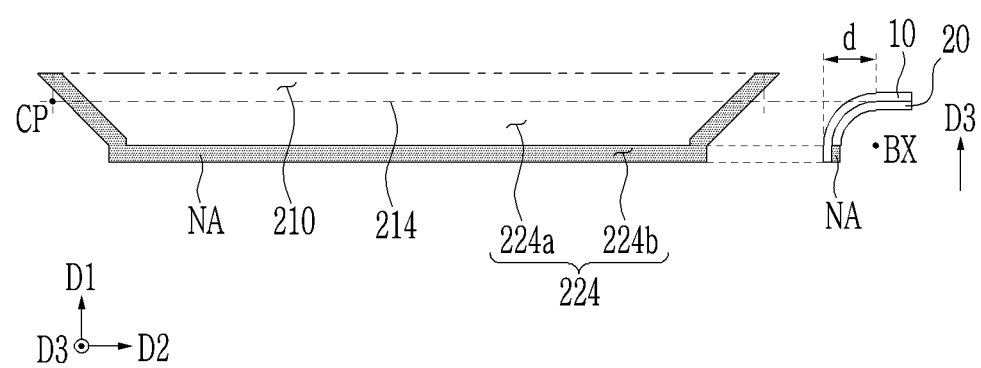
FIG. 14 is an enlarged view before bending and a cross-sectional view after bending for a lower region in a display panel in FIG. 13.

FIG. 13 is a plan view of a window that is built into a display device, a display panel, and a display device according to an embodiment, and FIG. 14 is an enlarged view before bending and a cross-sectional view after bending for a lower region in a display panel in FIG. 13. In FIG. 14, the cross-section view after bending also shows the window.

In the present embodiment, the first to fourth sub-panel regions 221-224 gradually decrease in width farther away from the first to fourth sides 211-214, respectively, and then have a constant shape. For example, the fourth sub-panel region 224 includes the first portion 224a, which is an equilateral trapezoid, and the second portion 224b, which is a rectangle. All regions of the second portion 224b may be the non-display area NA. If the second portion 224b having the constant width is formed in this way, it may be advantageous to secure the area where the signal lines connected to the pad part are disposed, for example. Among the first to fourth sub-panel regions 221-224, only the sub-panel region to which the pad part is connected may have this shape, and the remaining sub-panel regions may have a different shape (e.g., the equilateral trapezoid).

After bending of the display panel 20, the first portion 224a of the fourth sub-panel region 224 may be a curved surface bent around the bending axis BX, and the second portion 224b may be a plane parallel to the third direction D3. In the cross-sectional view of FIG. 14, the curved line formed by the first portion 224a may be the arc corresponding to about a quarter of the circle centered on the bending axis BX. Accordingly, the non-display area NA of the second portion 224b may not be visible from the front of the display device 1. When viewing the display device 1 from the front (in plan view), the overall shape and bezel are the same as described in the embodiment of FIG. 9.

In the following, the cross-sectional structure of the display panel 20 is described in detail with reference to FIG. 15.

Figure 15:
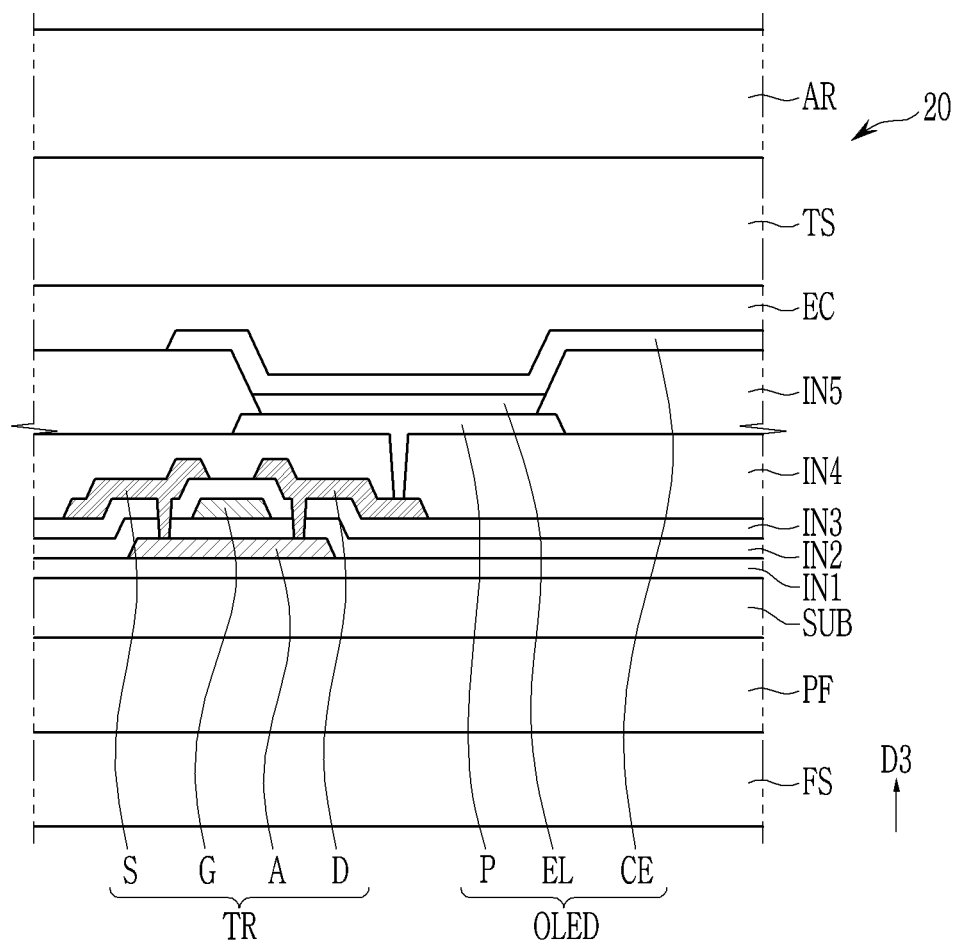
FIG. 15 is a cross-sectional view of a display panel according to an embodiment.

FIG. 15 is a cross-sectional view showing one example of a lamination structure of the display panel 20 according to an embodiment. The cross-section shown in FIG. 15 may correspond to approximately one pixel area. The display panel 20 basically includes a substrate SUB, a transistor TR formed on the substrate SUB, and an organic light emitting diode OLED connected to the transistor TR.

The substrate SUB may be a flexible substrate made of a polymer such as a polyimide, a polyamide, or a polyethylene terephthalate. The substrate SUB may include a barrier layer that prevents moisture and oxygen from penetrating from the outside. For example, in the substrate SUB, one or more polymer layers and at least one barrier layer may be alternately stacked.

A first insulating layer IN1 is disposed on the substrate SUB. The first insulating layer IN1 may be referred to as a buffer layer, and it blocks an impurity that may diffuse from the substrate SUB to the semiconductor layer A in the process of forming the semiconductor layer A and reduces the stress that the substrate SUB receives. The barrier layer and the first insulating layer IN1 may include inorganic insulating materials such as a silicon oxide and a silicon nitride.

The semiconductor layer A of the transistor TR is disposed on the first insulating layer IN1, and a second insulating layer IN2 is disposed on the semiconductor layer A. The semiconductor layer A includes a source region and a drain region, and a channel region between these regions. The semiconductor layer A may include a semiconductor material such as a polysilicon, an oxide semiconductor, or amorphous silicon. The second insulating layer IN2 may be referred to as a gate insulating layer, and may include an inorganic insulating material.

A gate conductor including a gate electrode G of the transistor TR is disposed on the second insulating layer IN2. The gate conductor may include a metal or metal alloy such as, for example, molybdenum (Mo), copper (Cu), aluminum (Al), silver (Ag), chromium (Cr), tantalum (Ta), and titanium (Ti).

A third insulating layer IN3 is disposed on the gate conductor. The third insulating layer IN3 may be referred to as an interlayer insulating layer, and may include an inorganic insulating material.

A data conductor including a source electrode S and a drain electrode D of the transistor TR is disposed on the third insulating layer IN3. The source electrode S and the drain electrode D are respectively connected to the source region and the drain region of the semiconductor layer A through contact holes formed in the third insulating layer IN3 and the second insulating layer IN2. The data conductor, for example, may include metals or metal alloys such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), and others.

A fourth insulating layer IN4 is disposed on the data conductor. The fourth insulating layer IN4 may be referred to as a passivation layer, a planarization layer, and the like, and may include an organic insulating material.

A pixel electrode P is disposed on the fourth insulating layer IN4. The pixel electrode P is connected to the drain electrode D through a contact hole formed in the fourth insulating layer IN4 to receive a data signal that controls luminance of the organic light emitting diode OLED.

A fifth insulating layer IN5 is disposed on the fourth insulating layer IN4. The fifth insulating layer IN5 may be referred to as a pixel defining layer, and has an opening overlapping the pixel electrode P. The emission layer EL is disposed above the pixel electrode P in the opening of the fifth insulating layer IN5, and the common electrode CE is positioned above the emission layer EL. The pixel electrode P, the emission layer EL, and the common electrode CE together constitute the organic light emitting diode OLED. The pixel electrode P may be an anode of the organic light emitting diode OLED, and the common electrode CE may be a cathode of the organic light emitting diode OLED. The common electrode CE can have light transmittance by forming a thin layer of a metal with low work function such as calcium (Ca), barium (Ba), magnesium (Mg), aluminum (Al), and silver (Ag). The common electrode CE may be formed of a transparent conductive material such as ITO or IZO.

An encapsulation layer EC is disposed on the common electrode CE. The encapsulation layer EC encapsulates the organic light emitting diode OLED to prevent moisture or oxygen from entering from the outside. The encapsulation layer EC may be a thin film encapsulation layer in which an inorganic material layer and/or an organic material layer are stacked.

A touch sensor layer TS may be disposed on the encapsulation layer EC. The touch sensor layer TS may include touch electrodes formed of a transparent conductive material such as ITO or IZO, a metal mesh, or the like, and the touch electrodes may be formed as a single layer or a multilayer.

An anti-reflection layer AR for reducing reflection of external light may be positioned on the touch sensor layer TS. The anti-reflection layer AR may include a polarization layer. On the anti-reflection layer AR, a protective layer to protect the display panel 20 may be disposed.

A protective layer PF and/or a functional sheet FS for protecting the display panel 20 may be disposed under the substrate SUB. The functional sheet FS may include a light shielding sheet, a heating sheet, a waterproof tape, a cushion tape, and the like.

Although the case where the display panel 20 is an organic light emitting panel has been described as an example, the display panel may be various display panels such as a display panel including a light emitting diode (LED) and a display panel including a liquid crystal layer, for example.

While the inventive concept has been described in connection with what is presently considered to be practical embodiments, it is to be understood that the inventive concept is not limited to the disclosed embodiments. On the contrary, it is intended to cover various modifications and equivalent arrangements included within the spirit and scope of the appended claims.

What is claimed is:

1. A display device comprising:
    a display panel and a window laminated with the display panel,
    wherein the display panel includes:
    a main panel region including a first side extending in a first direction and a second side extending in a second direction crossing the first direction;
    a first sub-panel region that is in contact with the first side and is bent; and
    a second sub-panel region that is in contact with the second side and is bent, and
    wherein a panel corner part of the main panel region adjacent to the first sub-panel region and the second sub-panel region is rounded,
    the window includes:
    a main window region including a first side extending in the first direction and a second side extending in the second direction;
    a first sub-window region in contact with the first side of the main window region; and
    a second sub-window region in contact with the second side of the main window region, and
    a window corner part of the main window region adjacent to the first sub-window region and the second sub-window region is rounded.

2. The display device of claim 1, wherein
    the panel corner part of the main panel region is spaced apart from an intersection of an extending line of the first side in the first direction and an extending line in the second direction of the second side in plan view.

3. The display device of claim 2, wherein
    a corner part of the display panel including the panel corner part of the main panel region is rounded in plan view.

4. The display device of claim 3, wherein
each of the main panel region, the first sub-panel region, and the second sub-panel region includes a display area and a non-display area, and
the non-display area of the first sub-panel region, the non-display area of the main panel region, and the non-display area of the second sub-panel region form a curved line that has no inflection point in the corner part of the display panel in plan view.

5. The display device of claim 1, wherein
the window, the display panel, or the window and the display panel include a light blocking member at a position corresponding to the non-display area of the main panel region.

6. The display device of claim 1, wherein
the window corner part of the main window region is spaced apart from an intersection of an extending line in the first direction of the first side of the main window region and an extending line in the second direction of the second side of the main window region in plan view.

7. The display device of claim 1, wherein
the main window region forms a plane, and each of the first sub-window region and the second sub-window region is bent.

8. The display device of claim 1, wherein
a corner part of the window including the window corner part of the main window region is rounded in plan view.

9. The display device of claim 1, wherein
the first side and the second side of the main window region respectively overlap the first side and the second side of the main panel region.

10. The display device of claim 1, wherein
the main panel region further includes a third side extending in the first direction and a fourth side extending in the second direction, and
the display panel further includes a third sub-panel region that is in contact with the third side and is bent, and a fourth sub-panel region that is in contact with the fourth side and is bent.

11. The display device of claim 10, wherein
at least one of the first to fourth sub-panel regions includes a first portion that is curved and a second portion that is planar.

12. A display device comprising
a display panel and a window laminated with the display panel,
wherein the window includes:
a main window region including a first side extending in a first direction and a second side extending in a second direction intersecting the first direction and forming a plane;
a first sub-window region that is in contact with the first side and is bent; and
a second sub-window region that is in contact with the second side and is bent, and
wherein a window corner part of the main window region adjacent to the first sub-window region and the second sub-window region is spaced apart from an intersection of an extending line in the first direction of the first side and an extending line in the second direction of the second side.

13. The display device of claim 12, wherein
when viewed from a front of the display device, an edge of the corner part of the main window region is rounded.

14. The display device of claim 12, wherein
each of the first sub-window region and the second sub-window region includes a curved surface.

15. The display device of claim 12, wherein
a corner part of the window including the window corner part of the main window region is rounded in plan view.

16. The display device of claim 15, further comprising:
a housing coupled to the window, and
the housing is in contact with an edge of the corner part of the window in plan view.

17. The display device of claim 12, wherein
the display panel includes a main panel region, a first sub-panel region in contact with the first side of the main panel region, and a second sub-panel region in contact with the second side of the main panel region,
wherein a panel corner part of the main panel region adjacent to the first sub-panel region and the second sub-panel region is spaced from an intersection of an extending line in the first direction of a first side and an extending line in the second direction of a second side of the main panel region.

18. The display device of claim 17, wherein
a corner part of the display panel including the panel corner part of the main panel region is rounded in plan view.

19. A display panel comprising:
a main panel region including a first side extending in a first direction and a second side extending in a second direction intersecting the first direction;
a first sub-panel region that is in contact with the first side and is bent around a bending axis parallel to the first side; and
a second sub-panel region that is in contact with the second side and is bent around a bending axis parallel to the second side,
wherein a panel corner part adjacent to the first and second sides is formed as a straight line before bending of the first and second sub-panel regions and is formed in a curve after bending of the first and second sub-panel regions.

* * * * *